United States Patent
Sechrist et al.

(10) Patent No.: US 10,050,361 B1
(45) Date of Patent: Aug. 14, 2018

(54) FLEXIBLE CIRCUIT CONNECTOR

(71) Applicant: TE CONNECTIVITY CORPORATION, Berwyn, PA (US)

(72) Inventors: Joshua Tyler Sechrist, Vancouver, WA (US); Arash Behziz, Newbury Park, CA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/600,899

(22) Filed: May 22, 2017

(51) Int. Cl.
| | | |
|---|---|---|
| *H01R 12/72* | (2011.01) | |
| *H01R 12/78* | (2011.01) | |
| *H01R 12/77* | (2011.01) | |
| *H01R 12/71* | (2011.01) | |
| *H01R 12/70* | (2011.01) | |
| *H05K 1/11* | (2006.01) | |
| *H05K 3/32* | (2006.01) | |

(52) U.S. Cl.
CPC ....... *H01R 12/724* (2013.01); *H01R 12/7076* (2013.01); *H01R 12/716* (2013.01); *H01R 12/775* (2013.01); *H01R 12/78* (2013.01); *H05K 1/11* (2013.01); *H05K 3/32* (2013.01)

(58) Field of Classification Search
CPC .... H01R 12/724; H01R 12/72; H01R 12/775; H01R 12/716
USPC .......................................................... 439/77
See application file for complete search history.

(56) References Cited

U.S. PATENT DOCUMENTS

| | | | | |
|---|---|---|---|---|
| 4,715,820 | A * | 12/1987 | Andrews, Jr. .......... | H01R 23/68 439/59 |
| 5,549,479 | A * | 8/1996 | Elco ....................... | H01R 12/79 439/267 |
| 6,247,951 | B1 * | 6/2001 | Di Liello ............... | H01R 12/61 439/329 |
| 6,299,476 | B1 * | 10/2001 | Schramme ........... | H01R 12/774 439/492 |
| 6,302,704 | B1 * | 10/2001 | Belanger, Jr. .......... | H01R 12/78 29/844 |
| 6,302,705 | B1 * | 10/2001 | Yatskov ................. | H01R 9/096 439/67 |
| 6,575,774 | B2 * | 6/2003 | Ling ...................... | H01R 13/53 439/101 |
| 6,783,371 | B2 * | 8/2004 | Self ........................ | H01R 4/027 439/493 |
| 7,645,146 | B2 * | 1/2010 | Lindkamp ............ | H01R 12/721 439/79 |
| 7,654,847 | B2 * | 2/2010 | Soubh ................ | G01R 1/06733 29/743 |
| 8,222,537 | B2 * | 7/2012 | Dudnikov, Jr. ...... | H05K 1/0257 174/256 |
| 8,465,327 | B2 * | 6/2013 | Springer ........... | H01R 13/6471 439/631 |

(Continued)

Primary Examiner — Alexander Gilman

(57) ABSTRACT

A flexible circuit connector includes a dielectric holder extending between a base mounted to a circuit board and a mating end mated with an electrical connector assembly. The dielectric holder has a first side and a second side with a first flexible circuit coupled to the first side and a second flexible circuit coupled to the second side. The flexible circuits each have a base edge extending to the base of the dielectric holder and a mating edge extending to the mating end of the dielectric holder. The flexible circuits each have signal conductors routed between the mating edge and the base edge and ground conductors providing electrical shielding for the signal conductors.

20 Claims, 4 Drawing Sheets

(56) References Cited

U.S. PATENT DOCUMENTS

| | | | |
|---|---|---|---|
| 8,523,583 B2 * | 9/2013 | Ito | H01R 12/721 |
| | | | 439/108 |
| 9,509,098 B1 * | 11/2016 | Henry | H01R 13/6471 |
| 9,664,868 B2 * | 5/2017 | Logan, Jr. | G02B 6/4293 |
| 2014/0127946 A1 * | 5/2014 | Ito | H01R 13/6599 |
| | | | 439/629 |

* cited by examiner

FLEXIBLE CIRCUIT CONNECTOR

BACKGROUND OF THE INVENTION

The subject matter herein relates generally to flexible circuit connectors.

Communication systems, such as network systems, servers, data centers, and the like, use large printed circuit boards, known as backplanes, to interconnect daughtercards, line cards and/or switch cards. Typically, the communication systems use high speed electrical connectors mounted to circuit boards or cards to transmit signals therebetween. The electrical connectors are fixed to the circuit boards. The system design is rigid and unable to accommodate changes to the system or rearranging of the components. As such, some communication systems use cable connectors rather than the electrical connectors mounted to circuit boards. However, the density of some cable connectors is limited. For example, the contacts of the cable connectors are typically held in a housing, which require a certain amount of spacing between the contacts. Reducing the spacing is difficult or impractical in some connector designs.

Some other known communication systems use flexible circuits, which may have tighter contact spacing as compared to cable connectors. However, termination of the flexible circuits to a circuit board is problematic. Direct connection of the flexible circuit to the circuit board, such as by soldering, is difficult or impractical. Other known systems utilize separate electrical connectors on the flexible circuit and on the circuit board, adding cost and complexity to the system and additional mating interfaces along the signal channels. The many interfaces introduce signal loss into the signal channels.

A need remains for a flexible circuit connector that may be terminated to a circuit board in a cost effective and reliable manner.

BRIEF DESCRIPTION OF THE INVENTION

In one embodiment, a flexible circuit connector is provided including a dielectric holder extending between a base configured to be mounted to a circuit board and a mating end configured to be mated with an electrical connector assembly. The dielectric holder has a first side and a second side with a first flexible circuit coupled to the first side of the dielectric holder and a second flexible circuit coupled to the second side of the dielectric holder. The first flexible circuit has a base edge extending to the base of the dielectric holder and a mating edge extending to the mating end of the dielectric holder. The first flexible circuit has signal conductors routed between the mating edge and the base edge and ground conductors providing electrical shielding for the signal conductors. The second flexible circuit has a base edge extending to the base of the dielectric holder and a mating edge extending to the mating end of the dielectric holder. The second flexible circuit has signal conductors routed between the mating edge and the base edge and ground conductors providing electrical shielding for the signal conductors.

In another embodiment, a flexible circuit connector is provided including a dielectric holder having a first side and a second side extending between a base and a mating end. The mating end is configured to be mated with an electrical connector assembly. The base is configured to be mounted to a circuit board. The base has a plurality of contact channels and a flexible circuit slot adjacent the contact channels at the first side. A flexible circuit is coupled to the first side of the dielectric holder. The flexible circuit has a base edge extending to the base of the dielectric holder and received in the flexible circuit slot. The flexible circuit has a mating edge extending to the mating end of the dielectric holder. The flexible circuit has signal conductors routed between the mating edge and the base edge and ground conductors providing electrical shielding for the signal conductors. Ground contacts are received in corresponding contact channels that are electrically connected to corresponding ground conductors at the base edge. Signal contacts are received in corresponding contact channels that are electrically connected to corresponding signal conductors at the base edge. The ground contacts and the signal contacts include mounting pins configured to be press-fit into corresponding vias in the circuit board to electrically connect the flexible circuit connector to the circuit board.

In a further embodiment, a communication system is provided including an electrical connector assembly having contacts defining an electrical interface, a circuit board having conductive vias defining an electrical interface and a flexible circuit connector electrically connected to the electrical interfaces of the electrical connector assembly and the circuit board to electrically connect the circuit board with the electrical connector assembly. The flexible circuit connector includes a dielectric holder extending between a base and a mating end and a flexible circuit coupled to the dielectric holder. The flexible circuit has a base edge extending to the base of the dielectric holder and a mating edge extending to the mating end of the dielectric holder. The flexible circuit has signal conductors routed between the mating edge and the base edge and ground conductors providing electrical shielding for the signal conductors. The signal conductors and the ground conductors are electrically connected to signal and ground contacts, respectively, held by the base and press-fit to corresponding conductive vias of the circuit board at the electrical interface of the circuit board. The signal conductors and the ground conductors are electrically connected to corresponding contacts of the electrical connector assembly at the electrical interface of the electrical connector assembly.

DETAILED DESCRIPTION OF THE INVENTION

Figure 1:
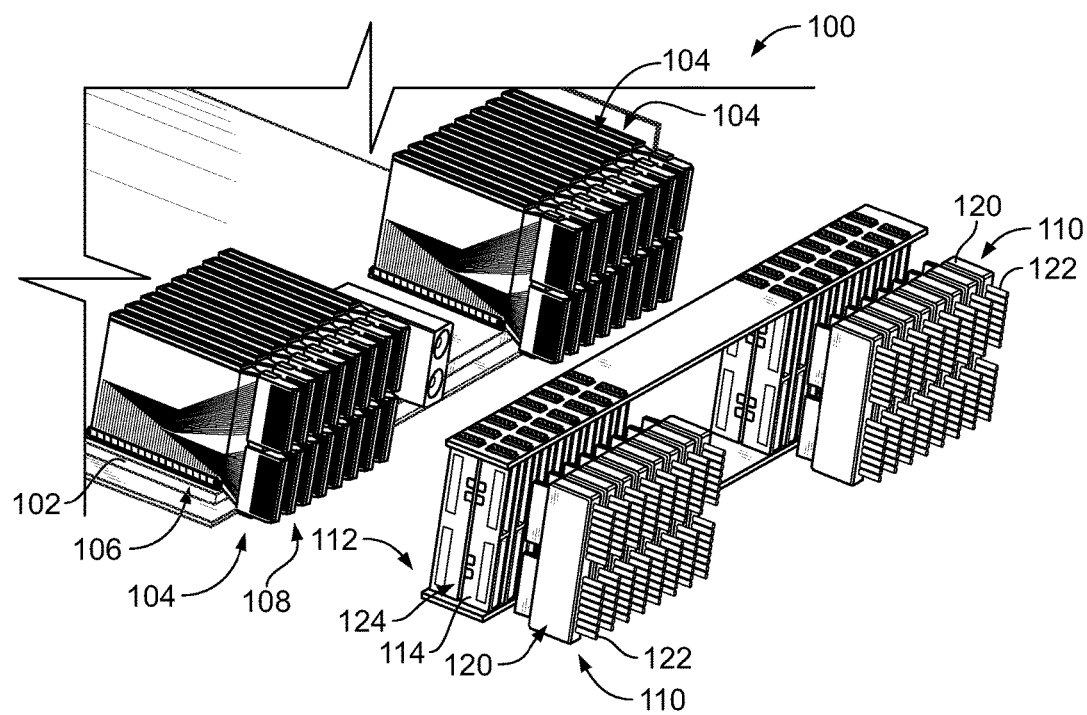
FIG. 1 illustrates a communication system formed in accordance with an embodiment.
Figure 2:
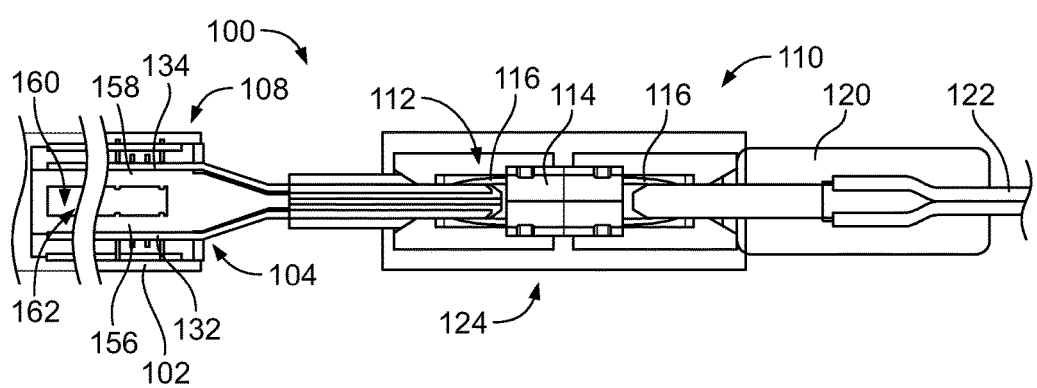
FIG. 2 is a top view of a portion of the communication system.

FIG. 1 illustrates a communication system 100 formed in accordance with an embodiment. FIG. 2 is a top view of a portion of the communication system 100. The communication system 100 includes a circuit board 102 and one or more flexible circuit connectors 104 mounted to the circuit board 102. The flexible circuit connectors 104 may be electrically connected to the circuit board 102 at mating interfaces 106, which may be a pluggable or press-fit interface. For example, in an exemplary embodiment, the flexible circuit connectors 104 may be press-fit to the circuit board 102 at the separable mating interfaces 106 during a pressing assembly. In such embodiments, the flexible circuit connectors 104 are terminated to the circuit board 102 without soldering to the circuit board 102, which may be a quicker assembly method and may be easily automated to reduce assembly cost. The flexible circuit connectors 104 and the circuit board 102 may define part of a card assembly 108, such as a circuit card or a daughtercard assembly.

The communication system 100 includes an electrical connector assembly 110 configured to be electrically connected to the flexible circuit connectors 104. The electrical connector assembly 110 includes separable mating interfaces 112 configured to be electrically connected to the flexible circuit connectors 104. The separable mating interface 112 may be defined by a housing 114, which may define a receptacle or socket configured to receive a mating end of the corresponding flexible circuit connector 104. The separable mating interface 112 may be defined by contacts 116 (one of which is shown in phantom in FIG. 2) held by the housing for mating with the corresponding flexible circuit connector 104. The contacts 116 may include signal contacts and/or ground contacts and/or power contacts.

In the illustrated embodiment, the electrical connector assembly 110 includes a plurality of cable connectors 120 terminated to ends of cables 122 (shown extending from one of the cable connectors 120 in FIG. 1). The cables 122 may be electrically connected to corresponding contacts 116. The cable connectors 120 and the flexible circuit connectors 104 are used for data communication, such as between the circuit board 102 and one or more other devices connected to the cables 122. The electrical connector assembly 110 may be part of a backplane assembly or other communication network or server component.

In various embodiments, the communication system 100 may include a plurality of the flexible circuit connectors 104 mounted to the circuit board 102 along an edge of the circuit board 102 in which each of the flexible circuit connectors 104 is configured to be electrically connected to a corresponding cable connector 120. One or more of the flexible circuit connectors 104 may be ganged together as part of a common unit. In the illustrated embodiment, the flexible circuit connector 104 is a right-angle connector such that the front or mating end and the bottom or mounting end are oriented substantially perpendicular or orthogonal to each other. More specifically, the front end faces in a receiving direction for mating with the cable connector 120 and the mounting end faces the circuit board 102. In other embodiments, the receiving side and the mounting side may face in different directions than those shown in FIG. 1.

Optionally, the cable connectors 120 may be directly mated with corresponding flexible circuit connectors 104 to provide signal communication therebetween. Alternatively, as in the illustrated embodiment, the electrical connector assembly 110 may include adapter connectors 124 between the cable connectors 120 and the flexible circuit connectors 104. The adapter connectors 124 may define the housing 114 and the contacts 116 and the cable connectors 120 may include corresponding housings and contacts. Optionally, both the flexible circuit connectors 104 and the cable connectors 120 may be plug connectors and the adapter connectors 124 may be double sided receptacle connectors configured to receive the flexible circuit connectors 104 and the cable connectors 120. Optionally, the flexible circuit connectors 104 and the cable connectors 120 may have identical mating interfaces and the adapter connectors 124 may be adapted to mate with both mating interfaces. Alternatively, such as in the direct mating embodiment, the flexible circuit connectors 104 and the cable connectors 120 may have complementary mating interfaces (for example, a plug interface and a receptacle interface). For example, the cable connectors 120 may define the housing 114 and the contacts 116. One or more of the cable connectors 120 and/or the adapter connectors 124 may be ganged together as part of a common unit.

Figure 3:
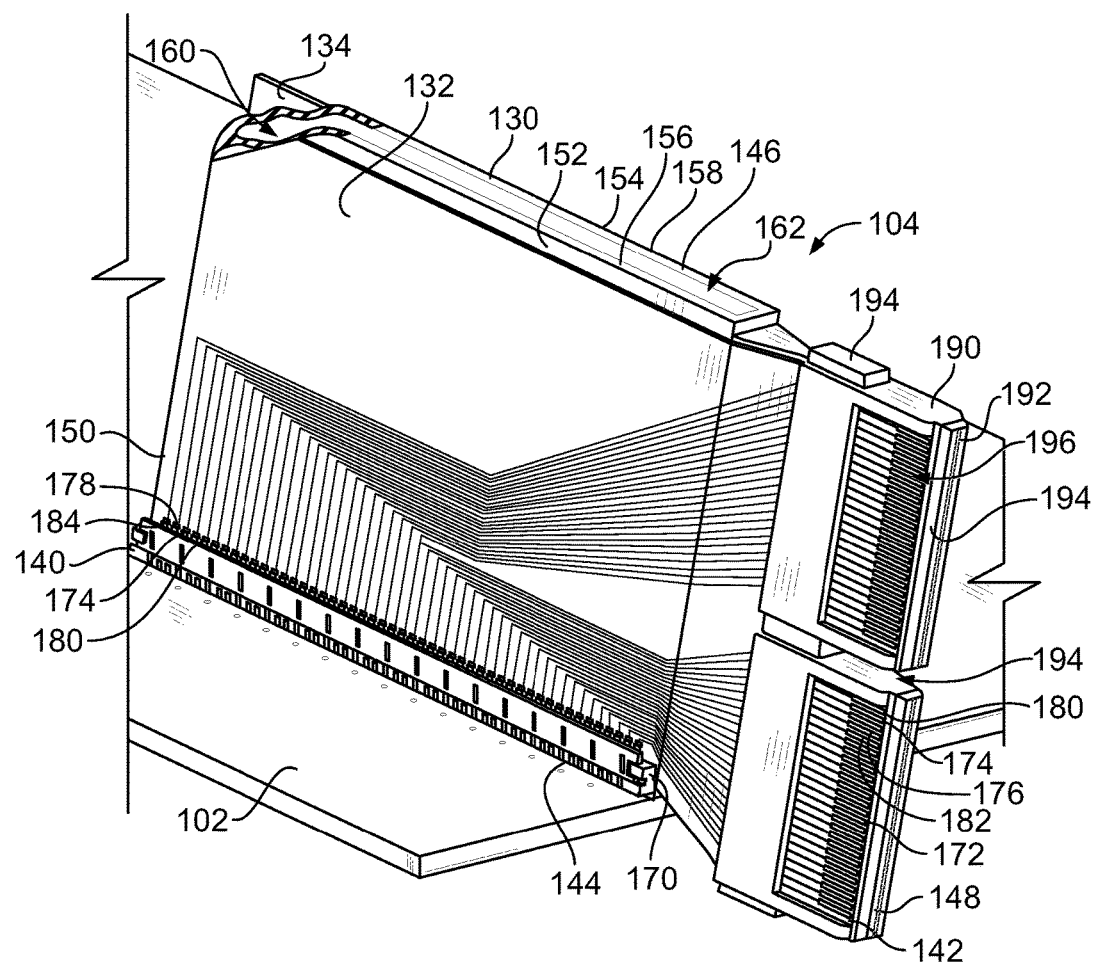
FIG. 3 illustrates a portion of the communication system showing a flexible circuit connector in accordance with an exemplary embodiment.

FIG. 3 illustrates a portion of the communication system 100 showing one of the flexible circuit connectors 104 coupled to the circuit board 102. The flexible circuit connector 104 includes a dielectric holder 130 holding a first flexible circuit 132 and a second flexible circuit 134 (a portion of the dielectric holder 130 is removed to illustrated the second flexible circuit 134). The dielectric holder 130 extends between a base 140 and a mating end 142. The mating end 142 is configured to be mated with the electrical connector assembly 110 (shown in FIG. 1). The base 140 is configured to be mounted to the circuit board 102.

In the illustrated embodiment, the base 140 is provided along a bottom 144 of the dielectric holder 130 generally opposite a top 146 of the dielectric holder 130. The mating end 142 is provided along a front 148 of the dielectric holder 130 generally opposite a rear 150 of the dielectric holder 130. However, other orientations are possible in alternative embodiments. For example, the mating end 142 may be provided along the top 146 or the rear 150 in alternative embodiments, or the base 140 may be provided along the rear 150 or the top 146. The dielectric holder 130 has a first side 152 and a second side 154 opposite the first side 152. The first and second sides 152, 154 may be generally planar extending between the top 146 and the bottom 144 and/or extending between the front 148 and the rear 150.

In an exemplary embodiment, the dielectric holder 130 includes a first spacer plate 156 at the first side 152 and a second spacer plate 158 at the second side 154. The dielectric holder 130 includes a chamber 160 between the first and second spacer plates 156, 158. The chamber 160 defines an air gap 162 between the first and second flexible circuits 132, 134. FIG. 2 illustrates the first and second spacer plates 156, 158 as well as the chamber 160 and the air gap 162. The first and second spacer plates 156, 158 may be connected, such as with connecting walls, at the bottom 144, the top 146, the front 148 and/or the rear 150. In the illustrated embodiment, the first and second spacer plates 156, 158 are connected at the front 148 and the rear 150 such that the chamber 160 is open at the top 146 and/or the bottom 144. The dielectric holder 130 may include other connecting walls that define strengthening ribs spanning across the chamber 160 to fix the relative positions of the first and second spacer plates 156, 158.

In an exemplary embodiment, the dielectric holder 130 may be thinned or narrowed at the mating end 142. For example, the front 148 may be thinner than the rear 150. The mating end 142 may be narrowed for mating with the electric connector assembly 110. Optionally, the dielectric holder 130 may be wider at the base 140, such as for mounting to the circuit board 102.

The first and second flexible circuits 132, 134 are coupled to the dielectric holder 130. For example, the first flexible circuit 132 is coupled to the first side 152, such as to the first spacer plate 156. The second flexible circuit 134 is coupled to the second side 154, such as to the second spacer plate 158. FIG. 2 illustrates the first and second flexible circuits 132, 134 coupled to the first and second sides 152, 154, respectively. The flexible circuits 132, 134 may be manufactured from a polyimide material, a PEEK material, a polyester material, and the like. The flexible circuits 132, 134 may be thin, flexible films. Optionally, the flexible circuits 132, 134 may be secured to the dielectric holder 130 using an adhesive material. The flexible circuits 132, 134 may be secured to the dielectric holder 130 by other means in alternative embodiments.

The dielectric holder 130 is rigid and fixes the relative positions of the first and second flexible circuits 132, 134. For example, because the first and second flexible circuits 132, 134 may be manufactured from a flex-circuit material, the first and second flexible circuits 132, 134 may be naturally flimsy and unsuitable for plug mating to the electrical connector assembly 110 or press assembly to the circuit board 102. By coupling the first and second flexible circuits 132, 134 to the dielectric holder 130, the first and second flexible circuits 132, 134 may be rigidly held and fixed in position for pluggable connection to the electrical connector assembly 110 and/or for press assembly to the circuit board 102.

In an exemplary embodiment, the first and second flexible circuits 132, 134 may be similar and include the same or similar components. The description herein is described in relation to the first flexible circuit 132; however, the second flexible circuit 134 may include all of, less than all of, or additional components depending on the particular application. In an exemplary embodiment, the first and second flexible circuits 132, 134 are mirrored components; however, the first and second flexible circuits 132, 134 may be identical components in alternative embodiments or may be different components depending on the particular application.

The flexible circuit 132 includes a base edge 170 extending to the base 140 of the dielectric holder 130, and a mating edge 172 extending to the mating end 142 of the dielectric holder 130. The flexible circuit 132 includes a plurality of signal conductors 174 routed between the mating edge 172 and the base edge 170. The signal conductors 174 may be traces of the flexible circuit 132. The signal conductors 174 may be routed on one or more layers of the flexible circuit 132. In an exemplary embodiment, the signal conductors 174 have first pads 176 at the mating edge 172 and second pads 178 at the base edge 170. The pads 176, 178 may be exposed on the outer surface of the flexible circuit 132 for electrical termination. For example, the first pads 176 may be electrically connected to the electrical connector assembly 110, such as to the contacts 116 (shown in FIG. 2). The second pads 178 may be electrically connected to contacts of the flexible circuit connector 104, as described in further detail below.

The flexible circuit 132 includes one or more ground conductors 180 that provide electrical shielding for the signal conductors 174. In an exemplary embodiment, the ground conductors 180 include first pads 182 at the mating edge 172 and second pads 184 at the base edge 170. The ground conductors 180 may include one or more traces extending between the mating edge 172 and the base edge 170. Optionally, the ground conductors 180 may include a ground layer covering one or more portions of the flexible circuit 132 or the entire flexible circuit 132. For example, the ground layer may extend from a top edge to a bottom edge and a front edge to a rear edge of the flexible circuit 132.

In an exemplary embodiment, the signal conductors 174 are arranged in pairs carrying differential signals. For example, the traces are arranged in pairs and the corresponding signal pads 176, 178 are arranged in pairs with the ground pads 182, 184 positioned between pairs of the signal pads 176, 178, respectively. The signal conductors 174 may be routed on one or more signal layers different from the ground layer. For example, the ground layer may be the interior-most layer of the flexible circuit 132 while one or more signal layers may be provided outside of the ground layer. The ground pads 182, 184 may be connected to the ground layer by vias through the flexible circuit 132. In alternative embodiments, rather than having a ground layer along a portion of or the entirety of the flexible circuit 132, the flexible circuit 132 may include ground traces on the same layer or layers as the signal traces. For example, the ground traces may be routed between pairs of signal traces.

In an exemplary embodiment, the flexible circuit connector 104 includes a front housing 190 coupled to the mating end 142 of the dielectric holder 130. The front housing 190 may be used for connecting to the electrical connector assembly 110. For example, the front housing 190 includes a mating end 192 that may be plugged into the electrical connector assembly 110.

The front housing 190 includes guide features 194 to orient the front housing 190 relative to the electrical connector assembly 110, such as the housing 114 (shown in FIG. 1) of the electrical connector assembly 110. The guide features 194 may guide mating with the electrical connector assembly 100 and/or may locate the final mated position of the flexible circuit connector 104 with the electrical connector assembly 110. The mating end 192 may define one or more of the guide features 194. Ribs, tabs, slots, or other features may define other guide features 194. In alternative embodiments, rather than providing the front housing 190, the mating end 142 of the dielectric holder 130 may define the mating interface with the electrical connector assembly 110.

The front housing 190 is coupled to the mating end 142 of the dielectric holder 130 such that the front housing 190 covers the mating edges 172 of the first and second flexible circuits 132, 134. In an exemplary embodiment, the front housing 190 includes one or more windows 196 exposing portions of the flexible circuits 132, 134. For example, the windows 196 may expose the signal conductors 174 and/or the ground conductors 180 for mating with the connectors 116 of the electrical connector assembly 110. The signal conductors 174 and the ground conductors 180 at the mating edges 172 of the first and second flexible circuits 132, 134 are exposed in the windows 196 rearward of the mating end 192 of the front housing 190.

Figure 4:
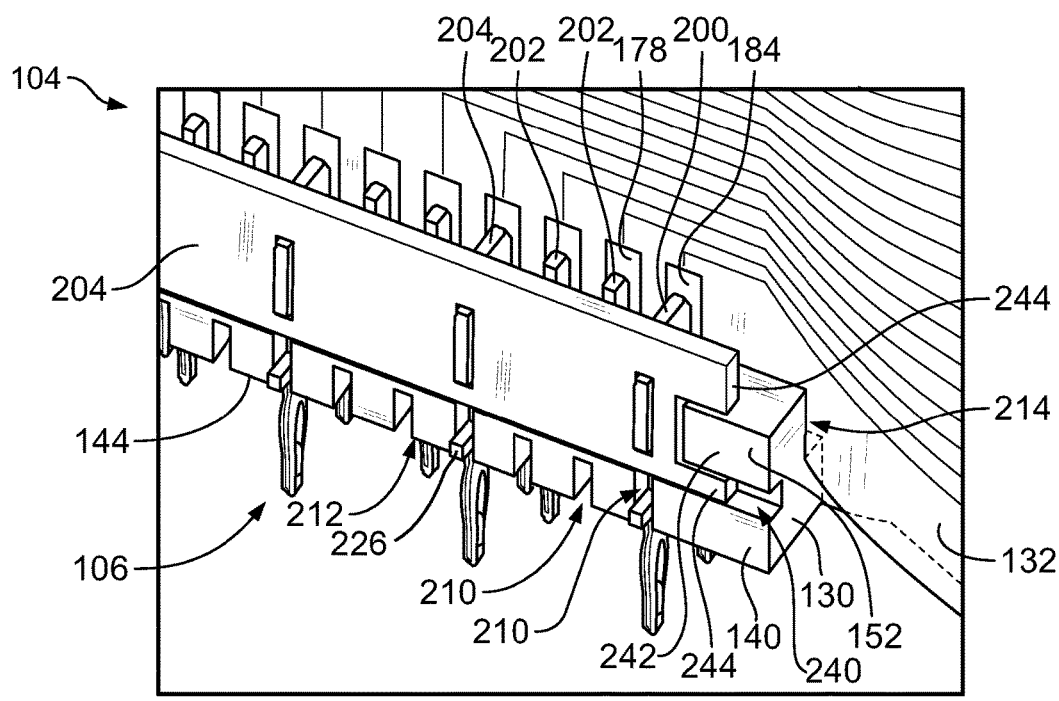
FIG. 4 illustrates a portion of the flexible circuit connector.
Figure 5:
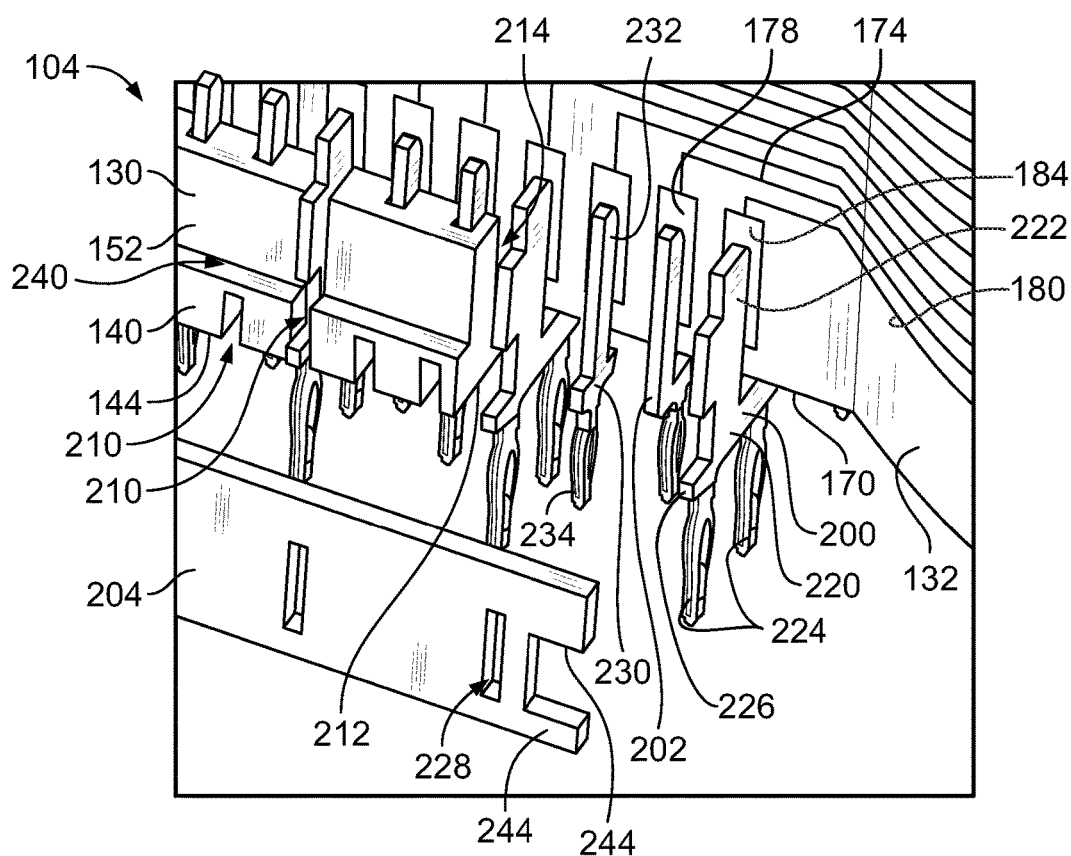
FIG. 5 is an exploded view of a portion of the flexible circuit connector.

FIG. 4 illustrates a portion of the flexible circuit connector 104 showing the base 140 of the dielectric holder 130 and a portion of the first flexible circuit 132. FIG. 5 is an exploded view of a portion of the flexible circuit connector 104 showing the base 140 of the dielectric holder 130 and a portion of the first flexible circuit 132. A portion of the base 140 is removed in FIG. 5 to illustrate the base edge 170 of the first flexible circuit 132.

The base 140 holds a plurality of ground contacts 200 and signal contacts 202 configured to be electrically connected to the circuit board 102 (shown in FIG. 1) at the mating interface 106. The flexible circuit connector 104 holds a ground strip 204 along the first side 152 at the base 140. Another ground strip 204 is held on the second side 154 (shown in FIG. 3) at the base 140. The ground strip 204 is used to electrically connect the ground contacts 200 to each other.

The base 140 has a plurality of contact channels 210 that receive corresponding ground contacts 200 and signal contacts 202. The contact channels 210 may be open at a mounting edge 212 of the base 140 at the bottom 144 of the dielectric holder 130. The contacts 200, 202 may be loaded into the contact channels 210 through the mounting edge 212.

The base 140 includes a flexible circuit slot 214 configured to receive a portion of the flexible circuit 132. The flexible circuit slot 214 may be open at a top of the base 140 to receive the base edge 170 of the flexible circuit 132. The flexible circuit slot 214 may fix the base edge 170 of the flexible circuit 132 against the first spacer plate 156 (shown in FIG. 3) at the first side 152. For example, the flexible circuit 132 may be horizontally and/or vertically fixed within the flexible circuit slot 214. The contact channels 210 may be open to the flexible circuit slot 214 such that the contacts 200, 202 within the contact channels 210 may be electrically connected to the flexible circuit 132. For example, portions of the signal conductors 174 and the ground conductors 180 may be received in the flexible circuit slot 214 for mating with the contacts 200, 202.

Each ground contact 200 includes a main body 220 configured to be received in the corresponding contact channel 210. The ground contact 200 includes a connecting beam 222 configured to be electrically connected to the corresponding ground conductor 180 of the flexible circuit 132, such as at the corresponding second pad 184. The ground contact 200 includes one or more mounting pins 224 extending from the bottom of the main body 220 configured to be electrically connected to the circuit board 102. In the illustrated embodiment, the mounting pins 224 are compliant pins, such as eye-of-the-needle pins, configured to be press-fit into corresponding conductive vias of the circuit board 102. Other types of mounting pins 224 may be provided in alternative embodiments.

The ground contacts 200 include connecting tabs 226 configured to be electrically connected to the ground strip 204. In the illustrated embodiment, the connecting tabs 226 extend from the outer side of the connecting beams 222. The connecting tabs 226 extend out of the contact channels 210 to an exterior of the base 140 for electrical connection to the ground strip 204. The connecting tabs 226 are configured to be press-fit into corresponding openings 228 in the ground strip 204 to electrically connect thereto. The ground contacts 200 may be electrically connected to the ground strip 204 by other means in alternative embodiments. For example, the ground strip 204 may include connecting features that extend into the base 140 to engage corresponding ground contacts 200 in alternative embodiments.

Each signal contact 202 includes a main body 230 configured to be received in the corresponding contact channel 210. The signal contact 202 includes a connecting beam 232 configured to be electrically connected to the corresponding signal conductor 174 of the flexible circuit 132, such as at the corresponding second pad 178. The signal contact 202 includes one or more mounting pins 234 extending from the bottom of the main body 230 configured to be electrically connected to the circuit board 102. In the illustrated embodiment, the mounting pins 234 are compliant pins, such as eye-of-the-needle pins, configured to be press-fit into corresponding conductive vias of the circuit board 102. Other types of mounting pins 234 may be provided in alternative embodiments.

In an exemplary embodiment, the signal contacts 202 are arranged in pairs configured to carry differential signals. Each pair of signal contacts 202 is surrounded on both sides by corresponding ground contacts 200. In an exemplary embodiment, the mounting pins 234 of the signal contacts 202 within each pair are staggered (for example, side-to-side) such that the mounting pins 234 are non-linear. For example, one of the mounting pins 234 within each pair is shifted towards the outside of the base 140 while the other mounting pin 234 within the pair is shifted toward the inside of the base 140. Staggering of the mounting pins 234 allows the signal contacts 202 to be arranged closer to each other. For example, the conductive vias in the circuit board 102 are spaced further apart by having the mounting pins 234 staggered as opposed to being arranged in a line. In an exemplary embodiment, the mounting pins 224 of the ground contacts 200 are staggered or offset with respect to the mounting pins 234 of the signal contacts 202. Staggering of the mounting pins 224, 234 allows closer positioning of the contacts 200, 202. For example, the conductive vias in the circuit board 102 may be staggered to increase the density of vias on the circuit board 102 and contacts 200, 202 on the flexible circuit connector 104.

The base 140 includes a ground strip groove 240 along the exterior thereof that receives the ground strip 204. The base 140 includes securing features 242 for securing the ground strip 204 in the ground strip groove 240. The ground strip 204 includes corresponding securing features 244 that engage the securing features 242 of the base 140 to hold the ground strip 204 on the base 140. In an exemplary embodiment, the ground strip 204 is side-loaded onto the base 140. As the ground strip 204 is coupled to the base 140, the ground strip 204 is electrically connected to the ground contacts 200. For example, the connecting tabs 226 are received in corresponding openings 228 as the ground strip 204 is side-loaded onto the base 140. Other securing means may be provided in alternative embodiments, such as fasteners, clips, adhesive and the like.

When the flexible circuit connector 104 is assembled, the flexible circuit 132 is secured to the dielectric holder 130. The contacts 200, 202 are loaded into the base 140 to electrically connect to the flexible circuit 132. The ground strip 204 is connected to the base 140 to electrically common the ground contacts 200. Once assembled, the flexible circuit connector 104 may be press-assembled to the circuit board 102. For example, the flexible circuit connector 104 may be pressed downward to electrically connect the contacts 200, 202 to the circuit board 102. The contacts 200, 202 may be electrically connected to the circuit board 102 without soldering the contacts 200, 202. For example, the contacts 200, 202 may be press-fit into the conductive vias of the circuit board 102. As such, the flexible circuit 132 (and the flexible circuit 134) may be press-assembled to the circuit board 102 using the rigid dielectric holder 130. The dielectric holder 130 provides rigidity to the flexible circuit 132 for press-assembly. The flex circuit 132 may be easily electrically connected to the circuit board 102 using the press-assembly process. The signal channels may be transmitted from the flexible circuit 132 to the circuit board 102 through the contacts 202, as opposed to passing through two contacts as occurs with systems having a connector on the flexible circuit and a mating connector on the circuit board.

The electrical connector assembly 104 defines a right angle connector assembly wherein the mating interfaces 106, 112 (shown in FIG. 1) are oriented perpendicular to each other. The mating interfaces 106, 112 are configured to be plugged into the circuit board 102 and the electrical connector assembly 110, respectively. The dielectric holder 130 provides rigidity to the flex circuits 132, 134 for plugging into the electrical connector assembly 110 and the circuit board 102.

Figure 6:
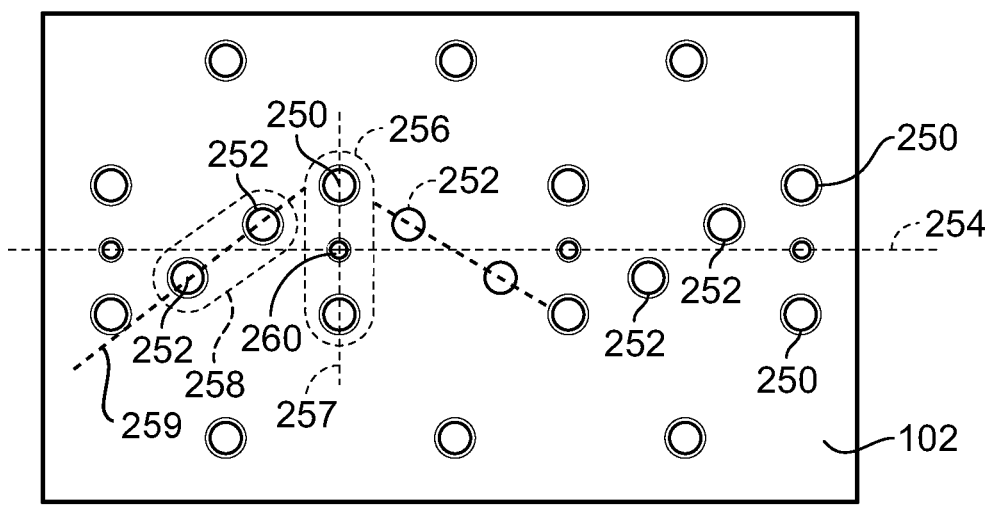
FIG. 6 illustrates the layout of conductive vias in a circuit board of the communication system.

FIG. 6 illustrates a layout of conductive vias 250, 252 in the circuit board 102, which corresponds to a layout of the mounting pins 224, 234 (shown in FIG. 5). The conductive vias 250 are ground vias configured to receive the mounting pins 224 of the ground contacts 200 (shown in FIG. 5). The conductive vias 252 are signal vias configured to receive the mounting pins 234 of the signal contacts 202 (shown in FIG. 5). The conductive vias 250, 252 are arranged along a connector axis 254, which may be generally centered below the flexible circuit connector 104 (shown in FIG. 5).

In an exemplary embodiment, the ground vias 250 are arranged in ground pairs 256 that are bisected by the connector axis 254. The ground pairs 256 are oriented along ground axes 257 perpendicular to the connector axis 254. The ground pairs 256 are aligned along the connector axis 254 with the ground vias 250 of each ground pair 256 arranged on respective opposite sides of the connector axis 254. Other orientations are possible in alternative embodiments.

In an exemplary embodiment, the signal vias 252 are arranged in signal pairs 258 that are bisected by the connector axis 254. The signal pairs 258 are oriented along signal pair axes 259 that are oblique to the connector axis 254. The signal vias 252 of each signal pair 258 are staggered on respective opposite sides of the connector axis 254. Staggering the signal vias 252 allows for a higher density of signal pairs 258 per length along the connector axis 254. Other orientations are possible in alternative embodiments.

Optionally, as in the illustrated embodiment, successive signal pair axes 259 are arranged along the connector axis 254 in an alternating sequence of ascending and descending slopes. Such an arrangement may enhance the electrical performance of the system by more closely coupling the same ground via 250 to each of the closest signal vias 252. Such an arrangement may also provide a direct line-of-sight between the closest signal vias 252 in different signal pairs 258. Such an arrangement may enhance the electrical performance of the system.

Optionally, the circuit board 102 may include signal integrity vias 260. The signal integrity vias 260 are plated vias that do not receive mounting pins. The signal integrity vias 260 may have a smaller diameter than the ground vias 250 or the signal vias 252. The signal integrity vias 260 may electrically connect ground layers of the circuit board 102 at additional locations different from the ground conductive vias 250, which may enhance the electrical performance of the system. Optionally, signal integrity vias 260 may be positioned between ground conductive vias 250 along the ground axes 257.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A flexible circuit connector comprising:
a dielectric holder extending between a base and a mating end, the mating end being configured to be mated with an electrical connector assembly, the base being configured to be mounted to a circuit board, the dielectric holder having a first side and a second side;
a first flexible circuit coupled to the first side of the dielectric holder, the first flexible circuit having a first flexible film, the first flexible circuit having a base edge extending proximate to the base of the dielectric holder, the first flexible circuit having a mating edge extending proximate to the mating end of the dielectric holder, the first flexible circuit having signal conductors routed on the first flexible film between the mating edge and the base edge, the first flexible circuit having ground conductors on the first flexible film providing electrical shielding for the signal conductors; and
a second flexible circuit coupled to the second side of the dielectric holder, the second flexible circuit having a second flexible film, the second flexible circuit having a base edge extending proximate to the base of the dielectric holder, the second flexible circuit having a mating edge extending proximate to the mating end of the dielectric holder, the second flexible circuit having signal conductors routed on the second flexible film between the mating edge and the base edge, the second flexible circuit having ground conductors on the second flexible film providing electrical shielding for the signal conductors.

2. The flexible circuit connector of claim 1, wherein the dielectric holder is rigid and fixes the relative positions of the first and second flexible circuits between the base edges and the mating edges thereof.

3. The flexible circuit connector of claim 1, wherein the base of the dielectric holder holds a plurality of ground contacts and signal contacts configured to be electrically connected to the circuit board at a mating interface.

4. The flexible circuit connector of claim 1, wherein the base includes a plurality of contact channels receiving ground contacts and signal contacts, the ground contacts and the signal contacts being electrically connected to corresponding ground conductors and signal conductors of the first and second flexible circuits, the ground contacts and the signal contacts having mounting pins configured to be press-fit into corresponding conductive vias in the circuit board.

5. The flexible circuit connector of claim 4, further comprising a first ground strip along the first side of the dielectric holder at the base and a second ground strip along the second side of the dielectric holder at the base, the first ground strip being coupled to a plurality of the ground contacts connected to the first flexible circuit, the second ground strip being coupled to a plurality of the ground contacts connected to the second flexible circuit.

6. The flexible circuit connector of claim 4, wherein the signal conductors and the signal contacts are arranged in pairs carrying differential signals, the mounting pins of the signal contacts within each pair being staggered such that the mounting pins of the signal contacts associated with the first flexible circuit are nonlinear and the mounting pins of the signal contacts associated with the second flexible circuit are nonlinear.

7. The flexible circuit connector of claim 1, wherein the base includes a first flexible circuit slot at the first side and a second flexible circuit slot at the second side, the base edge of the first flexible circuit being received in the first flexible circuit slot, the base edge of the second flexible circuit being received in the second flexible circuit slot.

8. The flexible circuit connector of claim 1, wherein the dielectric holder includes a first spacer plate at the first side and a second spacer plate at the second side, the dielectric holder defining a chamber between the first and second spacer plates, the chamber defining an air gap between the signal conductors of the first flexible circuit and the signal conductors of the second flexible circuit.

9. The flexible circuit connector of claim 1, wherein the base has a mounting edge at a bottom of the dielectric holder configured to be press assembled to the circuit board, the first and second flexible circuits being press assembled to the circuit board with the dielectric holder.

10. The flexible circuit connector of claim 1, further comprising a front housing coupled to the mating end of the dielectric holder, the front housing covering the mating edges of the first and second flexible circuits, the front holder including windows exposing the signal conductors and ground conductors at the mating edges of the first and second flexible circuits.

11. A flexible circuit connector comprising:
a dielectric holder having a first side and a second side, the dielectric holder extending between a base and a mating end, the mating end being configured to be mated with an electrical connector assembly, the base being configured to be mounted to a circuit board, the base having a plurality of contact channels, the base having a flexible circuit slot adjacent the contact channels at the first side;
a flexible circuit coupled to the first side of the dielectric holder, the flexible circuit having a flexible film, the flexible circuit having a base edge extending proximate to the base of the dielectric holder received in the flexible circuit slot, the flexible circuit having a mating edge extending proximate to the mating end of the dielectric holder, the flexible circuit having signal conductors routed on the flexible film between the mating edge and the base edge, the flexible circuit having ground conductors on the flexible film providing electrical shielding for the signal conductors;
ground contacts received in corresponding contact channels, the ground contacts being electrically connected to corresponding ground conductors at the base edge; and
signal contacts received in corresponding contact channels, the signal contacts being electrically connected to corresponding signal conductors at the base edge;
wherein the ground contacts and the signal contacts include mounting pins configured to be press-fit into corresponding vias in the circuit board to electrically connect the flexible circuit connector to the circuit board.

12. The flexible circuit connector of claim 11, wherein the dielectric holder is rigid and fixes the relative positions of the base edge and the mating edge of the flexible circuit.

13. The flexible circuit connector of claim 11, further comprising a second flexible circuit coupled to the second side of the dielectric holder, the second flexible circuit having a base edge extending to the base of the dielectric holder, the second flexible circuit having a mating edge extending to the mating end of the dielectric holder, the second flexible circuit having signal conductors routed between the mating edge and the base edge, the second flexible circuit having ground conductors providing electrical shielding for the signal conductors.

14. The flexible circuit connector of claim 11, further comprising a ground strip along the first side of the dielectric holder at the base, the ground strip being coupled to a plurality of the ground contacts.

15. The flexible circuit connector of claim 11, wherein the dielectric holder includes a first spacer plate at the first side and a second spacer plate at the second side, the dielectric holder defining a chamber between the first and second spacer plates, the chamber defining an air gap.

16. The flexible circuit connector of claim 11, wherein the base has a mounting edge at a bottom of the dielectric holder configured to be press assembled to the circuit board.

17. The flexible circuit connector of claim 11, further comprising a front housing coupled to the mating end of the dielectric holder, the front housing covering the mating edge of the flexible circuit, the front holder including a window exposing the signal conductors and ground conductors at the mating edge.

18. A communication system comprising:
an electrical connector assembly having contacts defining an electrical interface;
a circuit board having conductive vias defining an electrical interface; and
a flexible circuit connector electrically connected to the electrical interfaces of the electrical connector assembly and the circuit board to electrically connect the circuit board with the electrical connector assembly, the flexible circuit connector comprising a dielectric holder extending between a base and a mating end and a flexible circuit coupled to the dielectric holder, the flexible circuit having a flexible film, the flexible circuit having a base edge extending proximate to the base of the dielectric holder, the flexible circuit having a mating edge extending proximate to the mating end of the dielectric holder, the flexible circuit having signal conductors routed on the flexible film between the mating edge and the base edge, the flexible circuit having ground conductors on the flexible film providing electrical shielding for the signal conductors, the signal conductors and the ground conductors being electrically connected to signal and ground contacts, respectively, held by the base and press-fit to corresponding conductive vias of the circuit board at the electrical interface of the circuit board, the signal conductors and the ground conductors being electrically connected to corresponding contacts of the electrical connector assembly at the electrical interface of the electrical connector assembly.

19. The communication system of claim 18, wherein the dielectric holder is rigid and fixes the relative positions of the base edge and the mating edge of the flexible circuit.

20. The communication system of claim 18, further comprising a second flexible circuit coupled to the second side of the dielectric holder, the second flexible circuit having a base edge extending to the base of the dielectric holder, the second flexible circuit having a mating edge extending to the mating end of the dielectric holder, the second flexible circuit having signal conductors routed between the mating edge and the base edge, the second flexible circuit having ground conductors providing electrical shielding for the signal conductors.

* * * * *